(12) United States Patent
Patel et al.

(10) Patent No.: US 7,709,187 B2
(45) Date of Patent: May 4, 2010

(54) HIGH RESOLUTION IMAGING PROCESS USING AN IN-SITU IMAGE MODIFYING LAYER

(75) Inventors: Kaushal Patel, Wappingers Falls, NY (US); Wu-Song Huang, Poughkeepsie, NY (US); Margaret C. Lawson, LaGrangeville, NY (US); Jaione Tirapu Azpiroz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 730 days.

(21) Appl. No.: 11/551,824

(22) Filed: Oct. 23, 2006

(65) Prior Publication Data

US 2008/0145793 A1    Jun. 19, 2008

(51) Int. Cl.
  *G03F 7/26*   (2006.01)
(52) U.S. Cl. .................................... 430/313; 430/311
(58) Field of Classification Search ................ 430/311, 430/313, 394
See application file for complete search history.

(56) References Cited

U.S. PATENT DOCUMENTS

| 5,877,076 | A  | 3/1999  | Dai |
| 6,242,344 | B1 | 6/2001  | Koh et al. |
| 6,566,019 | B2 | 5/2003  | Kling et al. |
| 6,586,168 | B1 | 7/2003  | Ohsaki |
| 6,664,011 | B2 | 12/2003 | Lin et al. |
| 2005/0064322 | A1 | 3/2005 | Babich et al. |
| 2006/0223305 | A1 | 10/2006 | Jones et al. |

FOREIGN PATENT DOCUMENTS

EP       0504759 A1    9/1992

OTHER PUBLICATIONS

M. Paulus, B. Michel, O. Martin, "Near-field distribution in light-coupling masks for contact lithography", J. Vac. Sci. Technol. B, 17, 6, p. 3314-3317 (1999).
T. Milster, T. Chen, D. Nam, E. Schlesinger, "Maskless Lithography with Solid Immersion Lens Nano Probes", Proc. SPIE, 5567, p. 545 (2004).
J. Rogers, K. Paul, R. Jackman, G. Whitesides, "Using an elastomeric phase mask for sub-100nm photolithography in the optical near field", Appl. Phys. Lett., 70, 20, p. 2658-2660 (1997).
H. Schmid, Hans Biebuyck, B. Michel, O. Martin, "Light-coupling masks for lensless, sub-wavelength optical lithography", Appl. Phys. Lett., 72, 19, p. 2379-2381 (1998).
T. Ito, M. Ogino, T. Yamada, Y. Inao, T. Yamaguchi, N. Mizutani, R. Kuroda, "Fabrication of sub-100nm Patterns using Near-field Mask Lithography with Ultra-thin Resist Process", J. Photopolym. Sci. Technol., 18, 3, p. 435-441 (2005); and Ong et al (J. Vac. Sci. Technol. B, v1, 4, 1983).
E. Ong, et al, "A Two-Layer Photoresist Process for Patterning High-Reflectivity Substrates", J. Vac. Sci. Technol. B, vol. 1, No. 4, Oct.-Dec. 1983.
Ong, et al., "A two-layer photoresist process for patterning high-reflectivity substrates", Journal of Vacuum Science & Technology, vol. 1, No. 4, Oct. 1983, XP002468017, pp. 1247-1250.
International Search Report and Written Opinion for FIS920060027.

*Primary Examiner*—Kathleen Duda
(74) *Attorney, Agent, or Firm*—Wenjie Li

(57) ABSTRACT

A method of forming a patterned material layer on a substrate. A photoresist layer is formed on the substrate followed by an image modifying material formed on the photoresist. The image modifying material is patterned to form an image modifying pattern. The image modifying pattern and underlying photoresist are then exposed to suitable radiation. The image modifying pattern modifies the image intensity within the photoresist layer beneath the image modifying pattern. The resulting pattern is then transferred into the substrate.

23 Claims, 5 Drawing Sheets

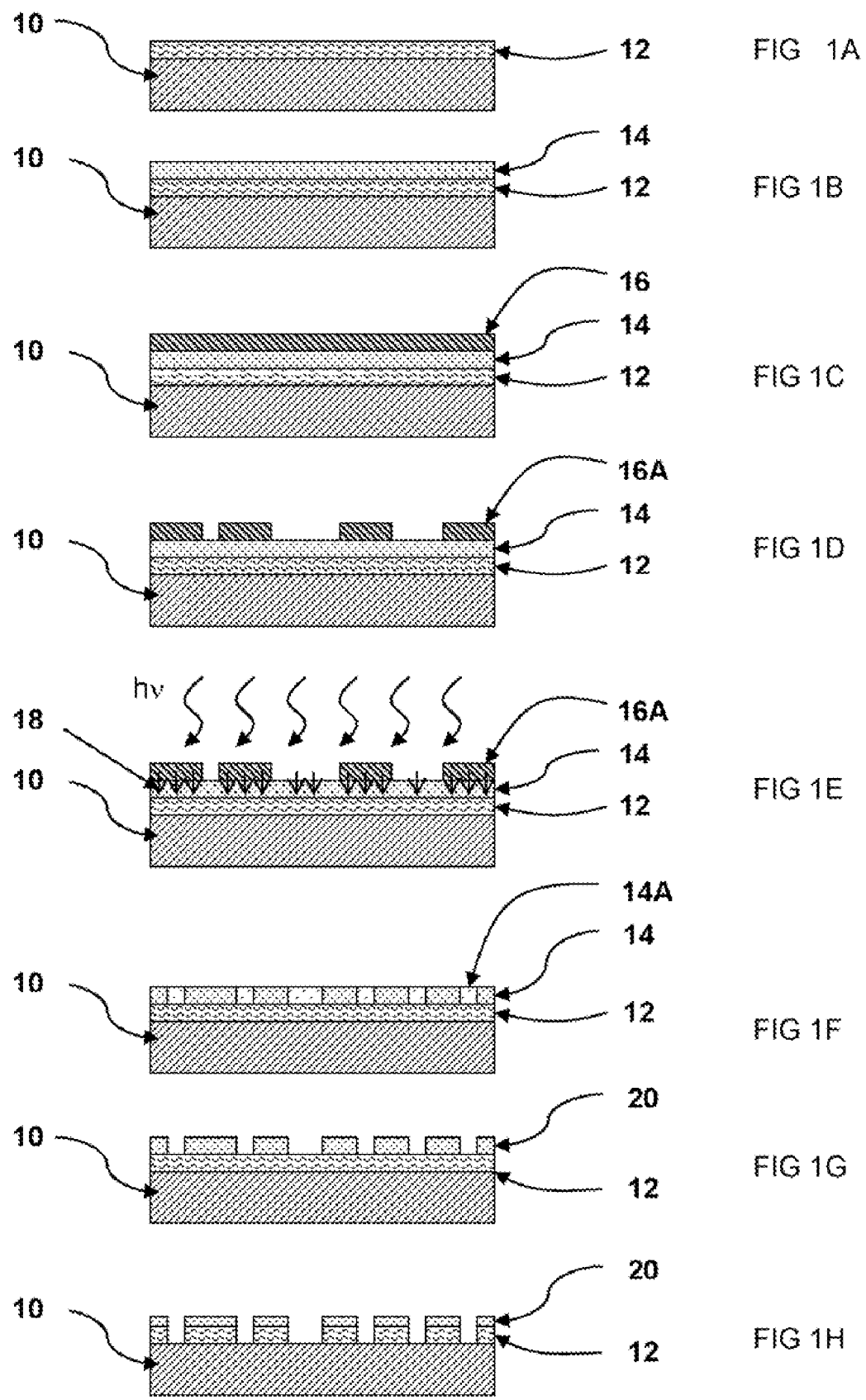

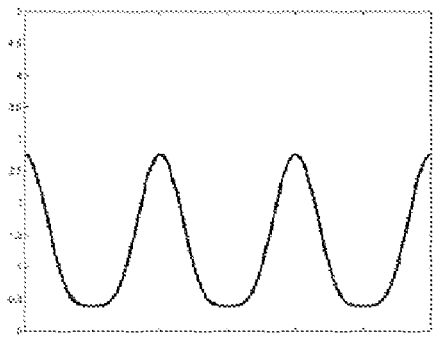
FIG 3A
Position on wafer
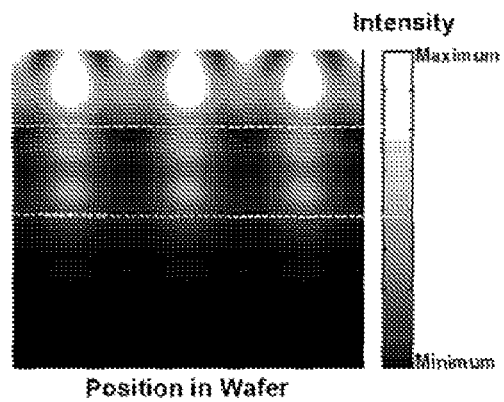
Position in Wafer
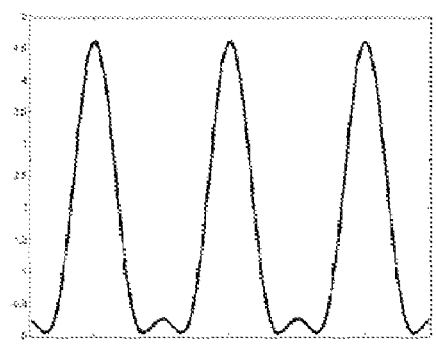
FIG 3B
Position on wafer
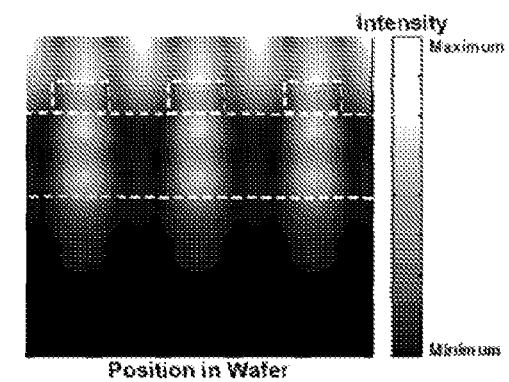
Position in Wafer
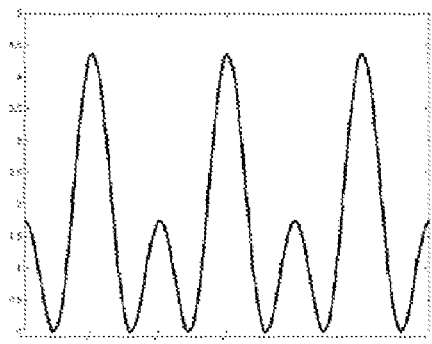
FIG 3C
Position on wafer
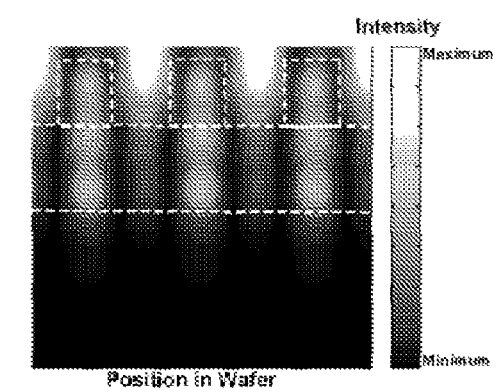
Position in Wafer

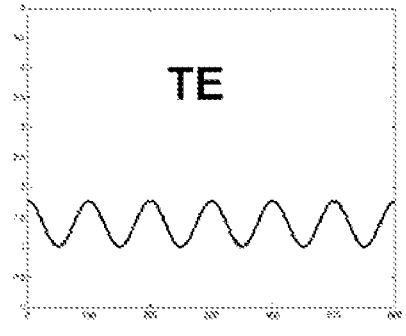
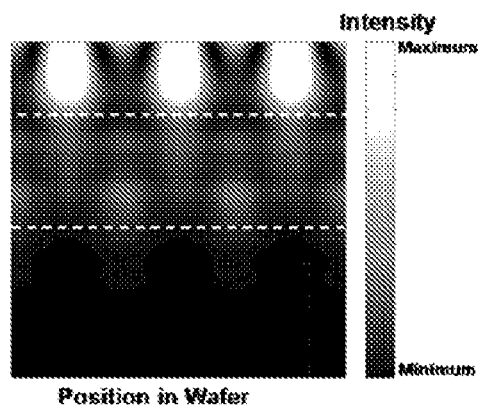
FIG 4A
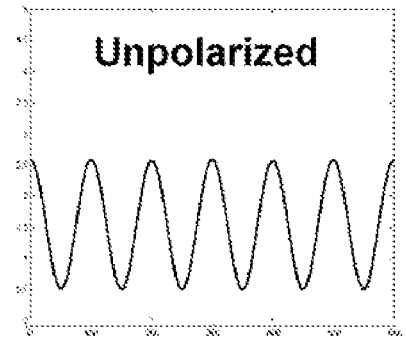
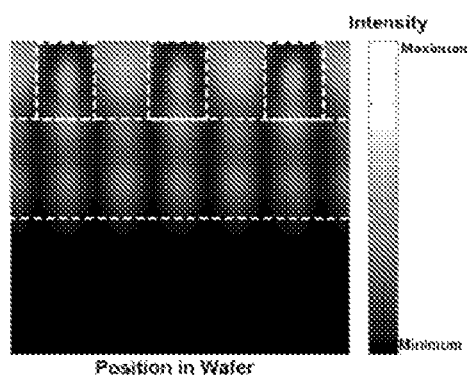
FIG 4B
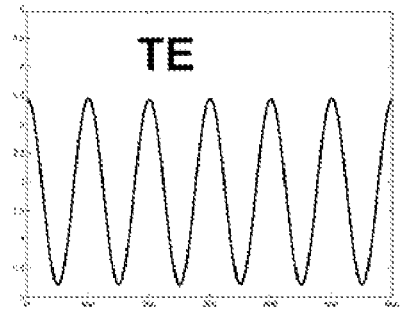
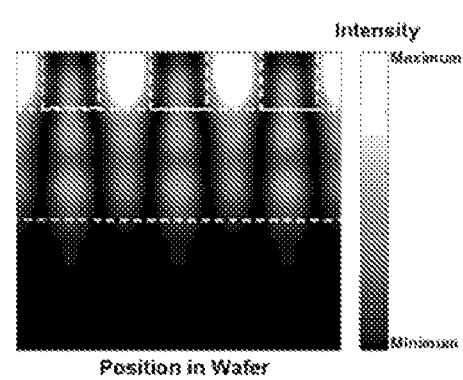
FIG 4C

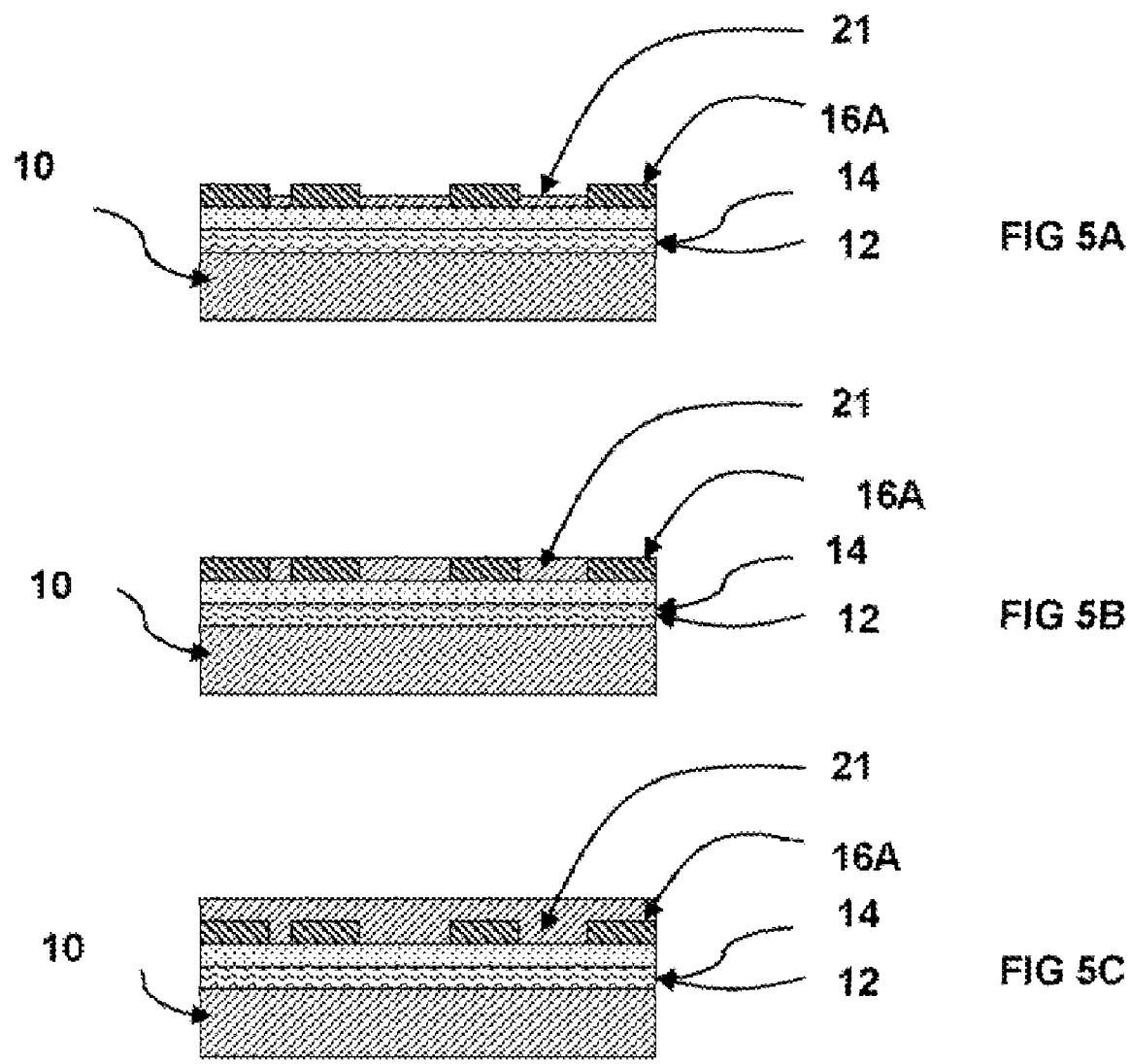

HIGH RESOLUTION IMAGING PROCESS USING AN IN-SITU IMAGE MODIFYING LAYER

FIELD OF THE INVENTION

The present invention relates to semiconductor lithographic processing and, more particularly, to a semiconductor lithographic processing method for obtaining high resolution semiconductor features.

BACKGROUND OF THE INVENTION

Semiconductor device manufacturing places high demands on the lithographic processes that are the means by which the submicron features are generated. New geometries and ever-shrinking dimensions of microelectronic devices dictate increased resist performance in terms of ability to produce higher resolution features with higher aspect ratios and the ability to image over topography.

The dramatic increase in performance and cost reduction in the electronics industry can be attributed in large parts to innovations in the field of optical lithography. Optical projection step-and-scan machines offer significantly higher throughput as compared to other patterning techniques and are the overwhelming choice for patterning advanced integrated circuits in manufacturing. The minimum printable feature size (resolution) has also decreased by orders of magnitude enabling more complex and higher density circuitry.

In optical projection lithography, resolution is typically governed by the equation.

$$W = k_1 \lambda / NA$$

where W is the minimum printable feature size, $\lambda$ is the exposure wavelength, NA is the numerical aperture and $k_1$ is constant representing the lithography process. To improve resolution, exposure wavelength has steadily decreased from mercury lamp G-line (436 nm) to H-line (405 nm) to I-line (365 nm) to deep UV (248 nm and 193 nm) while the numerical aperture of the optics has steadily increased.

Advances in resist materials, processes and mask making, and innovations such as reticle enhancement techniques (RET) and use of off-axis illumination (OAI) have also reduced $k_1$ to a point where its values in the range of 0.30-0.45 are typical in manufacturing today. Considering 0.25 is the theoretical limit of diffraction optics this is truly remarkable. Future gains in resolution will be achieved through enhancements such as immersion lithography. In immersion lithography, a fluid with an index of refraction greater than air (n=1.0) is introduced between the imaging surface and the last lens element of the imaging optics. This enables the numerical aperture of optical lithography systems to exceed 1.0 and possibly approach values close to the index of refraction of the immersion fluid. Using water as the immersion fluid, lithography systems with numerical apertures as high as 1.35 may be possible.

Further reduction in wavelength is yet another method to improve resolution. Possible options include $F_2$ excimer laser (157 nm) and extreme UV (13 nm) light. However, as wavelength becomes shorter, the light source becomes more complex and expensive. In addition, the technological complexity with imaging materials, processes, optics and masks required to support imaging using the shorter wavelength also increases dramatically. It is conceivable that the cost of migrating to a new wavelength may be prohibitive and unjustifiable from a fiscal perspective. Thus, it is conceivable that optical lithography using ArF excimer laser (193 nm) may be the only cost-effective optical lithography option available for some time to come. To extend ArF lithography for sub-wavelength patterning beyond the 90 nm half-pitch, process and material innovations will be crucial.

Near field imaging has been reported in recent years as a method to print features smaller than the diffraction limit of optical lithography. Researchers have reported printing of patterns as small as $\lambda/40$ where $\lambda$ is the wavelength of the incident radiation. Most optical near field lithography applications rely on placing an image transducer such as a conformal light-coupling mask or a solid immersion lens in very close proximity to the imaging photoresist layer while it is being irradiated. As the imaging radiation interacts with the image transducer it is altered. If the image transducer is of very small dimension then the alteration is only experienced within a very short distance from the transducer. Thus such effects are often classified as Near Field effects. The physical phenomenon behind the image alteration can be complex. Near field effect, phase shifting and evanescent wave effects are some of the complex explanations that have been provided. All near field imaging references in literature propose the utilization of a detached image modifying layer which is placed in close proximity to the imaging resist. See, for example, M. Paulus, B. Michel, O. Martin, "Near-field distribution in light-coupling masks for contact lithography", J. Vac. Sci. Technol. B, 17, 6, p 3314-3317 (1999); T. Milster: T. Chen, D. Nam, E. Schlesinger, "Maskless Lithography with Solid Immersion Lens Nano Probes", Proc. SPIE, 5567: p 545 (2004); J. Rogers, K. Paul, R. Jackman: G. Whitesides, "Using an elastomeric phase mask for sub-100 nm photolithography in the optical near field", Appl. Phys. Lett., 70, 20, p 2658-2660 (1997); H. Schmid, Hans Biebuyck, B. Michel, O. Martin, "Light-coupling masks for lensless, sub-wavelength optical lithography", Appl. Phys. Lett., 72, 19, p 2379-2381 (1998); T. Ito, M. Ogino, T. Yamada, Y. Inao, T. Yamaguchi, N. Mizutani, R. Kuroda "Fabrication of sub-100 nm Patterns using Near-field Mask Lithography with Ultra-thin Resist Process", J. Photopolym. Sci. Technol., 18, 3, p 435-441 (2005); and Ong et al (J. Vac. Sci. Technol, v1, 4, 1983), the disclosures of which are incorporated by reference herein.

There are several ways in which a single resist layer can be patterned using multiple exposures. Such methods typically utilize one resist and two masks. The two exposures can be complementary or may be overlapping. In the case of overlapping exposures, the resist is exposed with the first mask with a dose which is the same or smaller than the required dose to print an image, then the second exposure is done with second mask with the same or smaller than the required dose. With this one resist approach, some double exposures are used to enhance resolution such as to print gates as described in U.S. Pat. No. 6,586,168, the disclosure of which is incorporated by reference herein, some are used to correct features which are hard to correct with OPC such as to fix line end shortening as described in U.S. Pat. No. 6,566,019, the disclosure of which is incorporated by reference herein. When two resists are introduced in the double exposure approach, prior arts do not use the patterned top layer to modify the images of the bottom resist layer. The two layers are patterned independently to form additive features such as the applications for dual damascene processes as described in U.S. Pat. Nos. 6,242,344 and 5,877,076, the disclosures of which are incorporated by reference herein, or to form subtractive features such as the application to contact holes with packing and unpacking scheme as described in U.S. Pat. No. 6,664,011, the disclosure of which is incorporated by reference herein.

Accordingly, it is a purpose of the invention to have high resolution imaging of semiconductor features.

It is another purpose of the present invention to have high resolution imaging of semiconductor features in which an image modifying layer is utilized.

It is yet another purpose of the present invention to have high resolution imaging of semiconductor features in which the image modifying layer conforms to the topography of the underlying surface.

These and other purposes of the invention will become more apparent after referring to the following description of the invention in conjunction with the accompanying drawings,

BRIEF SUMMARY OF THE INVENTION

The purposes of the invention have been achieved by providing, according to a first aspect of the invention, a method of forming a patterned material layer on a substrate, the method comprising;

providing a substrate having a material layer on a surface thereof;

applying a photoresist composition on the material layer to form a photoresist layer on the material layer;

applying a material composition on the photoresist layer to form an image modifying material layer on the photoresist layer patterning the image modifying material layer to form an image modifying pattern on the photoresist layer;

exposing the image modifying pattern and photoresist layer using imaging radiation of wavelength $\lambda_1$ such that the image modifying pattern modifies the image intensity within the photoresist layer beneath the image modifying pattern;

removing the image modifying pattern;

developing portions of the photoresist layer to thereby form a patterned photoresist layer on the substrate; and transferring the patterned photoresist layer to the material layer, According to a second aspect of the invention, there is provided a method of forming a patterned material layer on a substrate, the method comprising:

providing a substrate having a material layer on a surface thereof;

applying a chemically amplified photoresist composition on the material layer to form a photoresist layer on the material layer;

applying a material composition on the photoresist layer to form an image modifying material layer on the photoresist layer;

patterning the image modifying material layer to form an image modifying pattern on the photoresist layer;

exposing the image modifying pattern and photoresist layer using imaging radiation of wavelength $\lambda_1$ such that the image modifying pattern preferentially enhances the image intensity within the photoresist layer beneath the image modifying pattern;

removing the image modifying pattern;

developing portions of the photoresist layer to thereby form a patterned photoresist layer on the substrate; and transferring the patterned photoresist layer to the material layer,

BRIEF DESCRIPTION OF THE DRAWINGS

FIGS. 1A to 1H are a schematical representation of an embodiment of the process according to the invention.

FIGS. 3A to 3C compare the image intensity in the photoresist layer when there is no image modifying layer (FIG. 3A) and an image modifying layer (FIGS. 3B and 3C).

FIGS. 4A to 4C compare the image intensity in the photoresist layer resulting from 3 beam interference exposure with FIG. 4A having no image modifying layer and FIGS. 4B and 4C having an image modifying layer.

FIGS. 5A to 5C illustrate variations on the process step illustrated in FIG. 1D.

DETAILED DESCRIPTION OF THE INVENTION

Figure 2A:
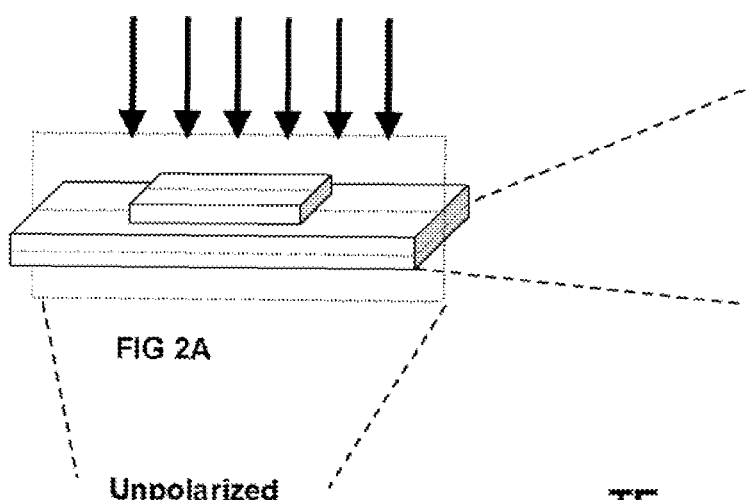
FIG. 2A is a schematical representation of an image modifying layer on a photoresist and FIGS. 2B to 2D are computer simulations of intensity variations in the photoresist layer due to the image modifying layer.

The present invention describes a method for printing high resolution patterns in a multilayer imaging stack through use of an in-situ image modifying layer. This method offers advantages for patterning sub-wavelength features similar to those claimed for near field imaging. Our invention differs from near field imaging since we propose attaching the image modifying layer directly on top of the imaging photoresist resulting in formation of an in-situ image modifying pattern layer. Conventional far field imaging utilizes a 4× reduction mask in which the mask features are four times the dimension of the final printed pattern in the photoresist. For near field imaging it becomes necessary to fabricate an 1× mask (i.e., the mask features are of similar dimensions of the final printed pattern) which would encounter substantial technological challenge and incur high cost. The contact near field printing would introduce defects to the resists, contamination to the masks and many other drawbacks well known in the contact printing system. If an air gap is introduced between the mask and the resist, the fidelity of the images would decay substantially owing to the narrow depth of the near field images. In the present inventions the in-situ image modifying pattern layer is attached to the bottom resist layer, thus alleviating the above described problems. Another advantage of the invention consists of the possibility of exposing the image modifying layer with impinging light that exhibits a patterned wavefront. This variation opens up the possibility to more sophisticated effects of the image modifying layer on the final image coupled into the underlaying resist layer.

Such an image modifying layer can be patterned using a variety of lithographic techniques and can enable printing of features much smaller than the wavelength of the imaging radiation. Patterning techniques for patterning the image modifying layer include, but are not limited to, optical lithography, subtractive nanoimprint lithography, additive nanoimprint lithography, step-and-flash imprint lithography, solid immersion lens near-field imaging, direct write electron-beam, direct-write ion beam lithography and direct beam x-ray lithography. The present invention is different from the prior art double exposure techniques. In most conventional double expose processes the pattern created after the first exposure does not optically participate during the second exposure to modify the images of the bottom layer. In fact, it is desirable that the latent image in the resist created by the two exposures do not interact for conventional double exposure processes utilizing a single imaging resist layer. In prior arts, the second exposure is to add patterns to the first exposure or to subtract patterns from the first exposure. Sometimes in the additive approach, the first exposure only provides an insufficient dose, then the second exposure provides the same or a different dose as first exposure to render certain overlap area having sufficient dose for image. No teaching was provided to use top layer images to modify the images of the bottom layer resist. The advantages of this invention over the prior art double exposure techniques are having no overlay issue, not diffraction limited, more tolerance to substrate topography and able to print patterns different from the mask.

The present invention also differs from the process traditionally referred to as a bilayer resist scheme. In a bilayer resist scheme, a patterned photoresist layer is utilized as an etch resistant hard mask for transferring the pattern into an underlying material layer using a reactive ion etch process. In the present invention the patterned image modifying layer is utilized to preferentially enhance the optical image intensity in the underlying imaging photoresist. The present invention also differs from bilayer resist processes where a patterned photoresist layer is utilized as an opaque optical mask for transferring low resolution patterns into an underlying photoresist layer as described by Ong et al (above) since in the present invention the patterned image modifying layer is not optically opaque and is used to enhance the image intensity in the underlying imaging photoresist directly beneath the image modifying pattern enabling high resolution patterning.

Referring now to the Figures, and particularly referring to FIGS. 1A through 1H, there is one preferred embodiment of the present invention in which an optical imaging method of forming a high resolution pattern in a photoresist layer on a substrate is disclosed. The method comprises the steps of providing a substrate 10 with a ceramic, dielectric, metal or semiconducting material layer 12 on the surface (FIG. 1A); applying a photoresist composition on the material layer 12 to form a photoresist layer 14 (FIG. 1B); applying a material composition on the photoresist layer 14 to form an image modifying layer 16 on the photoresist layer 14 (FIG. 1C), patterning the image modifying layer 16 using optical lithography to form an image modifying pattern 16A on the photoresist layer 14 (FIG. 1D); exposing the photoresist layer 14 using imaging radiation of wavelength $\lambda_1$ such that the image modifying pattern 16A preferentially enhances the image intensity 18 within the photoresist layer beneath the image modifying pattern 16A (FIG. 1E); removing the image modifying pattern 16A (FIG. 1F); applying a photoresist developer to render portions 14A of the photoresist layer 14 soluble in the photoresist developer solution; removing the soluble portions 14A of the photoresist layer 14 to form a patterned photoresist layer 20 on the substrate 10 (FIG. 1G), and transferring the patterned photoresist layer 20 to the material layer 12 using a conventional method such as reactive ion etching (FIG. 1H).

The reflectivity of the material layer 12 upon which the photoresist layer 14 is coated can also affect the optimal implementation of this invention. Accordingly, It is preferred that the material layer 12 and the substrate 10 provide a low reflectivity surface and reflect less than 10% of the incident lights more preferably less than 4%, and most preferably less than 0.5%. To achieve this low reflectivity, an inorganic or organic bottom antireflective coating (BARC) optionally can be applied onto the substrate 10 in this invention. The typical inorganic BARCs are titanium dioxide, titanium nitride, chromium oxide, silicon nitride, and silicon oxynitride. The typical organic BARCs for 248 nm KrF exposure source contain polymers having anthracene, aromatic imides, naphthalene and arylsulfones. The typical organic BARCs for 193 nm ArF exposure source contain phenyl and phenol. To facilitate fast etch rate, these organic BARCs are usually containing acrylate, methacrylate or ester polymers. The inorganic BARCs are mostly coated on the substrate with vacuum deposition, chemical vapor deposition or sputtering. The organic BARCs are coated on the substrate 10 with spin coating. There are many commercial organic BARCs material that can be applied to this invention, e.g. AR series from Rohm and Haas Co., DUV series from Brewer science Co. Recently, there has been a need to apply wet developable BARC to eliminate the ARC opening step. The D-BARCs are available from AZ Co. To reduce the high reflectivity from the introduction of high NA (>1), there is a need to use graded BARC or Dual BARC. Alternatively, silicon ARC can be used in the high NA exposure with a trilayer scheme.

In the following paragraphs, one preferred embodiment of the method according to the invention will be described in more detail.

The photoresist layer 14 can comprise a positive-tone or negative-tone photoresist. Chemically amplified photoresist are suitable for this purpose due to their high contrast and widespread use in semiconductor manufacturing. The photoresist composition is selected based on its sensitivity to imaging radiation to certain wavelengths which typically range between 1 nm and 800 nm. If a high resolution pattern is desired the wavelength range is preferably greater than 1 nm and less than 249 nm. At present 193 nm excimer laser sources are common in semiconductor manufacturing and hence would be the more preferred wavelength. After the photoresist layer 14 is coated onto the material layer 12, it may be heated to an elevated temperature in order to form the photoresist layer 14. Temperatures ranging from 0 degrees to 400 degrees may be applied, however the preferred range is between 0 degrees to 200 degrees, and the most preferred range for 193 nm sensitive photoresist is 50 degrees to 150 degrees.

Once the photoresist layer 14 has been baked it is coated with the image modifying material to form the image modifying layer 16. It is preferable if the solvent used to cast the image modifying layer 16 is a non-solvent of the photoresist layer 14. Examples of solvents for the image modifying layer 16 include water, alcohols, ethers, other organic fluids or supercritical fluids of chemicals such as carbon dioxide.

After the image modifying layer 16 is coated onto the photoresist layer 14 it may be heated to an elevated temperature. Temperatures ranging from 0 degrees to 400 degrees may be applied, however the preferred range is between 0 degrees to 200 degrees, and the most preferred range for 193 nm sensitive photoresist is 50 degrees to 150 degrees. It is also preferable to choose the image modifying layer 16 such that during its processing the photoresist layer 14 is not affected in a way which is detrimental to its imaging performance.

In some instances it may be preferred to optionally coat the image modifying layer 16 with a top-coat material for image enhancement, swing reduction, defect mitigation and as a protective barrier from an immersion fluid in immersion lithography. The typical top antireflective coating (TARC) material contains fluorine to achieve low refractive index. Commercial TARC materials useful for this invention are AZ Aquatar series from AZ Electronic Materials Co. and NFC series from JSR Co. Most of the TARC materials are water soluble for the dry lithography. For immersion lithography, the TARC materials are not water soluble. The main applications for top-coat materials are to prevent leaching of components from resist and to prevent water effect on the resist lithographic performance. Since water is not the desirable solvent, most of these top-coat materials are soluble in alcohol. Commercial top-coat materials useful for this invention are TCX series from JSR Co. and TARP from AZ electronic Materials Co. Another desired attribute of a top-coat material is the ability to bleach upon exposure which can enable further enhancement in contrast.

The image modifying layer 16 can be patterned using optical lithography. To achieve this, the image modifying material is a photoresist composition which is sensitive to imaging radiation. The photoresist composition of the image modifying material can be a positive-tone or negative-tone photoresist. Chemically amplified photoresist are suitable for this purpose due to their high contrast and widespread use in semiconductor manufacturing. The photoresist composition of the image modifying material is selected based on its sensitivity to imaging radiation to certain wavelengths which typically range between 1 nm and 800 nm. If a high resolution pattern is desired the wavelength range is preferably greater than 1 nm and less than 249 nm. At present 193 nm excimer laser sources are common in semiconductor manufacturing and hence would be the more preferred wavelength.

The image modifying material layer is pattern-wise exposed to this imaging radiation to form a chemical image in the image modifying material layer corresponding to the pattern. Pattern-wise exposure may be performed using a patterned photomask of a type selected from the group consisting of chrome-on-glass reticle attenuated phase shift mask, alternating phase shift, chromeless phase shift mask or vortex phase shift mask or combinations thereof. The exposed image modifying layer may be heated to an elevated temperature in order to complete the chemical reaction necessary to bind the imaged pattern in the image modifying material layer and preferentially render portions of image modifying material layer soluble in a developer solution. Temperatures ranging from 0 degrees to 400 degrees may be applied, however the preferred range is between 0 degrees to 200 degrees, and the most preferred range for 193 nm sensitive photoresist is 50 degrees to 150 degrees. Next, the image modifying material layer is exposed to a developer solution which removes the exposed portions for a positive-tone composition, or the unexposed portions for a negative-tone composition. Aqueous base developers are typically preferred as developer solutions for chemically amplified photoresist, more preferably 0.263N tetramethyl ammonium hydroxide solution is used.

Once the image modifying pattern 16A has been formed on the photoresist layer 14, in some instances it may be preferred to coat the image modifying pattern 16A with a top-coat material for image enhancement, swing reduction, defect mitigation and as a protective barrier from an immersion fluid in immersion lithography. AZ Aquatar series from AZ Electronic Materials Co. and NFC series from JSR Co. are typical commercial TARC materials for dry lithography, TCX series from JSR Co. and TARP from AZ electronic Materials Co. are typical TARC/barrier layers for immersion lithography.

Alternatively, once the desired image pattern has been transferred onto the image modifying layer and the layer possesses the desired topography as shown in FIG. 1D, it may be desirable to fill the areas of image modifying material removed by the developer, with an alternative image modifying material 21 having optical properties selected to further enhance the imaging of the photoresist layer as shown in FIGS. 5A, 5B and 5C. Thus, the image modifying effects can then be optimized with the use of additional degrees of freedom offered by the optical properties of this second image modifying material. This second image modifying material 21 can exhibit similar optical properties as the existing image modifying material which, for 193 nm wavelength imaging the preferred range for real refractive index for the image modifying layer and the photoresist layer is in the range 1.2 to 2.2, and more preferably in the range 1.35 to 1.9. The preferred range for optical absorbance is from 0 to 1.0, and more preferably from 0 to 0.25. The thickness of the alternative image modifying material can range from 0 nm up to the height of the existing image modifying material as shown in FIGS. 5A and 5B. It is also conceivable that the alternative image modifying material completely covers and encapsulates the existing image modifying material with a planar or conformal coating as shown in FIG. 5C. The alternative image modifying material can be a positive-tone or negative-tone resist and preferably is a chemically amplified resist. The addition of an extra one or more image modification layers is optional. Its advantages can be easily realized by combining the effect of the first image modifying layer 16 with the second image modifying layer 21 based on the currently described invention here. Therefore, it is expected that any person skilled in the art can use this inventive concept of one image modification layer and expand it to multiple image modification layers.

Next, the photoresist layer 14 is exposed to imaging radiation to which it is sensitive. The exposure of the photoresist layer 14 and the in-situ image modifying layer 16 can be performed using either flood exposure, multiple beam interference exposure or pattern-wise exposure. If flood exposure is utilized, the exposure of the photoresist layer 14 becomes insensitive to focus errors which can be limiting for other double exposure techniques. Pattern-wise exposure may be performed using a patterned photomask of a type selected from the group consisting of chrome-on-glass reticle, attenuated phase shift mask, alternating phase shift, chromeless phase shift mask or vortex phase shift mask or combinations thereof. Light polarization may be selected for maximum benefit for a group consisting of unpolarized light, circularly polarized light, TE polarized light, and TM polarized light. The illumination method for exposure may be selected from a group comprising of incoherent beam imaging, coherent beam imaging, conventional illumination, and off-axis illumination.

Figure 2B:
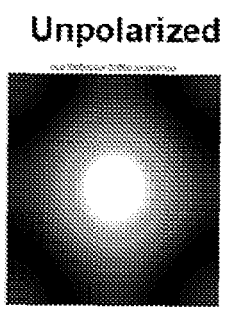
Figure 2C:
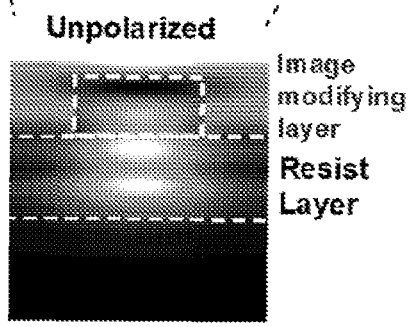
Figure 2D:
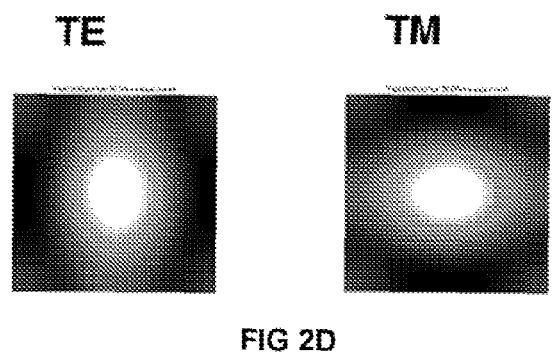

To demonstrate how the image modifying pattern 16S uniquely affects the image intensity within the photoresist layer 14 computer simulations are useful. Electromagnetic field simulators similar to Tempest 6.0 available from the University of Berkeley, Calif. are effective tools for such simulations. In FIG. 2, we demonstrate how an 86 nm thick, 100 nm wide image modifying pattern affects the image intensity within an underlying 200 nm thick photoresist layer upon flood exposure to 193 nm radiation. For this simulation the present inventors assume a complex refractive index of 1.56+0.01i for the image modifying material and 1.70+0.025i for the photoresist material. As shown in FIG. 2A, there is a possible 3 dimensional architecture of a 100 nm wide image modifying layer placed on top of a 200 nm thick photoresist layer illuminated with an unpatterned plane wave at normal incidence. FIG. 2B shows a cross sectional view across the resist and image modifying layers of the image intensity simulated with a full 3D electromagnetic simulator (FDTD Tempest 6.0). The compound of resist layer and image modifying layer was illuminated with a plane wave at normal incidence and both TE and TM polarizations were incoherently superposed to simulate the effect of unpolarized light. Shown in dotted lines in FIG. 28 are the image modifying layer and resist layer. Shown in FIG. 2C is a cross sectional view parallel to the resist surface of the image intensity averaged across the resist thickness with unpolarized illumination while shown in FIG. 2D are similar views of the resist image for TE polarized illumination and TM polarized illumination. As is evident from the simulation, the image modifying pattern affects the incident light in a unique way by causing an intensification of image intensity within the photoresist layer directly underneath the pattern. No pattern would be formed in the absence of the top image modifying layer. Similar intensification of light in close proximity to a detached image transducer has also been reported in near field imaging literature. In the present invention, however, the in-situ image modifying pattern layer is attached to the bottom resist layer, thus alleviating the problems associated with near field imaging system such as difficulty in 1× mask fabrication, resist defects and mask contamination. As is commonly understood in the field of photolithography, it is possible to convert this intensified image within the photoresist into an image pattern after further processing. It is likely that the resolution of this intensified image is not limited by diffraction and thus this approach has the potential to be utilized for very high resolution image patterning.

The benefits of this invention are even more pronounced when multiple beam interference exposure of the bottom photoresist is employed. In FIG. 3, we compare the image intensity within the photoresist for three cases: (A) no image modifying pattern, (B) a 40 nm thick, 90 nm wide image modifying pattern spaced at 200 nm pitch, and (C) a 80 nm thick, 90 nm wide image modifying pattern spaced at 200 nm pitch. As shown on the right side of FIG. 3, there are image intensity profiles for each of the three cases upon three-beam interference exposure in a 200 nm thick photoresist layer and the image modifying layer simulated with a full 3D electromagnetic simulator (FDTD Tempest 6.0). As shown on the left in FIG. 3, there are simulated image intensity averaged across the resist thickness and plotted along the plane of the resist surface for each of the three cases. As the simulations clearly demonstrate, the image contrast as determined by the average normalized image log-slope (NILS) is substantially enhanced by the presence of the image modifying pattern. For certain targeted critical dimensions, a NILS enhancement as high as 300% was estimated due to the presence of the image modifying pattern. Thus it is clear that the image modifying pattern provides substantial contrast enhancement benefits in a manner that can be properly optimized for the desired application as noticed by the differences between cases (A) and (B) (FIGS. 3A and 3B). Another advantage as the simulations indicate is that the full width at half maximum of image intensity in the bottom photoresist is reduced when an image modifying pattern is present. This indicates that significant feature size reduction may also be possible using the method described in this invention.

When pattern-wise exposure of the bottom photoresist is employed benefits similar to those described above are anticipated.

The image transducing effect of the image modifying pattern can be altered in many ways. Optical properties of the image modifying material and photoresist at the wavelength of imaging radiation can significantly influence the overall imaging. For instance, increasing the real part of the refractive index (n) of the image modifying material may provide improved contrast for certain imaging application. In other cases increasing the imaginary part of the refractive index (k) may provide the most benefit. For 193 nm wavelength imaging the preferred range for the real part of the refractive index for the image modifying layer and the photoresist layer is in the range 1.2 to 2.2, and more preferably in the range 1.35 to 1.9. The preferred range for the imaginary part of the refractive index is from 0 to 1.0, and more preferably from 0 to 0.25. Careful selection of the image modifying layer materials and topography is needed through full physical electromagnetic simulations to control the image modifying effect pursued for each different application of this invention.

Other parameters which affect the image transducing effect of the image modifying layer include the thickness of the image modifying pattern and the thickness of the photoresist. For certain geometries, the image modifying pattern may shift the phase of the light entering the photoresist layer thus acting as a phase shifting layer. These effects are nontrivial and may require thorough examination prior to selecting the right thickness. The same can be said about how the profile of the image modifying pattern may affect the imaging, A benefit of this invention may be the ability to easily change the image profile of the image modifying pattern. The sidewall angle of the image modifying pattern can be engineered to be either less than 90 degrees close to 90 degrees (near vertical), or greater than 90 degrees. In particular if the image modifying pattern is formed using optical lithography methods, various process and material parameters can be varied to achieve the desired effect, Methods such as solid immersion lens or conformal phase mask are limited in this ability since the profiles are determined once the lens or mask is fabricated.

The design of the image modifying pattern is a key aspect that must be carefully considered while implementing this invention. The image modifying pattern affects the image intensity in the bottom photoresist in a very complex and non-trivial way. To print the desired image pattern in the bottom photoresist careful consideration must be made in the layout and design of the image modifying pattern using procedures common in the field, Common practices from the fields including circuit design, layout, mask design, optical proximity correction, optical reticle correction, and design for manufacturing are applicable to this process. Designing the image modifying pattern with special consideration to precisely locate the edges of the image modifying pattern for maximum benefit is one example since the edge tends to enhance the intensity of the incident light in close proximity to its location as shown in the simulations provided.

One advantage of the present invention over other double exposure methods is that the pattern in the image modifying layer provides perfect overlay for the second exposure of the bottom photoresist layer due to the fact that the image modifying pattern is attached to the photoresist layer 14.

Another advantage of this invention is that since the image modifying pattern is attached to the surface of the photoresist layer it can conform to topography of the photoresist layer. This conformal nature of the image modifying layer along with the unique imaging advantages it provides, offers substantial relief over conventional imaging when image intensity distribution in the photoresist must remain robust as the focus changes due to varying substrate topography.

Yet, another advantage of this invention is that since the image modifying pattern is attached to the surface of the photoresist layer, the latent images produced on the photoresists are not diffraction limited similar to the near field lithography, and are unlike those double exposure prior arts which are using far field exposures.

The image intensity reversal within the photoresist layer 14 due to interaction of the imaging light with the image modifying layer can also be utilized to enable complementary mask imaging. A certain image modifying pattern can be reversed in the final bottom photoresist pattern due to image modification effect demonstrated in our simulations.

Frequency doubling of the topography of the image modifying material within the photoresist layer 14 obtained through the careful selection of the imaging light intensity and focus properties with the image modifying layer 16 can also be utilized to enable advanced imaging capability with existing technology, The pitch of a certain image modifying pattern can be reduced by a factor of 2 in the final photoresist pattern with enhanced contrast capable of producing printable patterns due to image modification effects demonstrated in our simulations. Similar frequency doubling effects have long been obtained and demonstrated through the use of interferometry and plane wave incidence. FIG. 4 shows simulated image intensity and average image intensity profiles upon three-beam interference exposure of a 200 nm thick photoresist layer coated (A) with no image modifying layer, (B) with a 50 nm thick, 90 nm wide image modifying pattern placed at a 200 nm pitch, and (C) a 80 nm thick, 90 nm wide image modifying pattern placed at a 200 nm pitch. As indicated by FIG. 4(A), frequency doubling can be accomplished without image modifying layer by a proper choice of the focal plane when exposing with standard 3Beam interference utilizing conventional imaging systems, The present invention offers the advantage of enhancing the contrast of the double frequency pattern formed in the resist layer and produce resist patterns with half the pitch of the image modifying pattern with the use of conventional imaging systems, This effect was observed through full electromagnetic simulation and is shown in FIGS. 4(B) and (C) for the case of unpolarized illumination and TE polarized illumination, respectively. The width and thickness of the image modifying pattern can be optimized for the desired frequency doubting application.

The present invention also offers the ability to be implemented using the high volume manufacturing infrastructure available in the semiconductor industry. Near field imaging applications reported in the literature as discussed above all propose the use of an image transducing layer having the same dimensions as the final desired pattern (1× magnification). This limits the throughput possible with those techniques and also makes the processes highly sensitive to defects and thus prohibitive in cost. The present invention allows the use of conventional optical lithography processes which are amenable to high volume manufacturing and typically involve a 4× reduction from the mask image to the patterned photoresist image. The image modifying pattern can be easily generated using this approach.

A comment on adapting this invention for current semiconductor manufacturing procedures is that in addition to creating models for optical proximity correction (OPC) to support the application of this invention calibration data must be collected to include the capability to model the physical phenomenon and the unique consequences described in this invention, Simulating the electromagnetic field effects caused by the topography of the image modifying pattern is one such example. Such a model would assist in the choice of mask type, design and layout, light polarization choice, and illumination method for both exposures specifically selected to gain the maximum advantages offered by this invention. Therefore, this invented process is not limited to the examples shown in a few simulation embodiments described in this application.

As noted briefly before, the exposed photoresist layer 14 may be heated to an elevated temperature in order to complete the chemical reaction necessary to bind the enhanced image pattern in the bottom photoresist layer and preferentially render portions of bottom photoresist layer soluble in a developer solution. Temperatures ranging from 0 degrees to 400 degrees may be applied however the preferred range is between 0 degrees to 200 degrees, and the most preferred range for 193 nm sensitive photoresist is 50 degrees to 150 degrees. Next, the bottom photoresist layer is exposed to a developer solution which removes the exposed portions for a positive-tone composition, or the unexposed portions for a negative-tone composition. Aqueous base developers are typically preferred as developer solutions for chemically amplified photoresist, more preferably 0.263N tetramethyl ammonium hydroxide solution is used.

With judicious design it is possible to prepare a positive photoresist composition of the image modifying material such that the exposure energy incident on the image modifying pattern during the exposure of the bottom photoresist layer is sufficient to render the remaining insoluble image modifying pattern soluble in the developer solution. Thus during the removal of the soluble portions of the exposed bottom photoresist, the remaining image modifying pattern is simultaneously removed.

Finally, as shown in FIG. 1H, the patterned image in the bottom photoresist layer 20 is transferred to the material layer 12 using methods such as reactive ion etching, ion implantation, chemical vapor deposition electroplating, electroless plating, metal sputtering, or metal evaporation.

Besides logic and memory semiconductor manufacturing, the basic process described in the present invention may be applicable to fields such as high resolution compact disk and digital video disk printing high resolution flat panel display patterning, electronic organic packaging, micro-electro-mechanical subsystem (MEMS) fabrication, opto-electronics device fabrication and any other application where high volume, high resolution patterning is required.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method of forming a patterned material layer on a substrate, the method comprising:
   a. providing a substrate having a material layer on a surface thereof;
   b. applying a photoresist composition on the material layer to form a photoresist layer on the material layer;
   c. applying a material composition on the photoresist layer to form an image modifying material layer on the photoresist layer;
   d. patterning the image modifying material layer to form an image modifying pattern on the photoresist layer;
   e. exposing the image modifying pattern and photoresist layer using imaging radiation of wavelength $\lambda_1$ such that the image modifying pattern causes an intensification of the image intensity within the photoresist layer directly beneath the image modifying pattern, wherein the image modifying pattern is not optically opaque at the imaging radiation wavelength $\lambda_1$
   f. removing the image modifying pattern;
   g. developing portions of the photoresist layer to thereby form a patterned photoresist layer on the substrate; and
   h. transferring the patterned photoresist layer to the material layer.

2. The method of claim 1, wherein the imaging radiation wavelength $\lambda_1$ is greater than 1 nm and less than 800 nm.

3. The method of claim 1, wherein the imaging radiation wavelength $\lambda_1$ is greater than 1 nm and less than 249 nm.

4. The method of claim 1, wherein the imaging radiation wavelength $\lambda_1$ is 193 nm.

5. The method of claim 4, wherein the image modifying material layer has an imaginary part of the refractive index in the range from 0 to 0.25 at the imaging radiation wavelength $\lambda_1$.

6. The method of claim 1, wherein the photoresist composition is a positive tone photoresist.

7. The method of claim 1, wherein the image modifying material layer is a photoresist and the image modifying pattern is formed by pattern-wise exposing the image modifying layer using imaging radiation of wavelength $\lambda_2$ followed by developing of portions of the image modifying layer to thereby form the image modifying pattern.

8. The method of claim 7 wherein the imaging radiation wavelength $\lambda_2$ is greater than 1 nm and less than 800 nm.

9. The method of claim 7 wherein the imaging radiation wavelength $\lambda_2$ is greater than 1 nm and less than 249 nm.

10. The method of claim 7 wherein the imaging radiation wavelength $\lambda_2$ is 193 nm.

11. The method of claim 1, wherein the image modifying material layer is selected from the group consisting of positive tone photoresists and negative tone photoresists.

12. The method of claim 1 wherein the image modifying pattern in step d. comprises openings and further comprising a step after step d. of applying a complementary image modifying material in the openings to form part of the image modifying pattern.

13. The method of claim 12 wherein the complementary image modifying material layer is selected from the group consisting of positive tone photoresists and negative tone photoresists.

14. The method of claim 1 wherein the image modifying material layer is coated with a top antireflective coating.

15. The method of claim 1 wherein the substrate is coated with a bottom antireflective coating.

16. The method claim 1 wherein the image modifying material pattern formed on the photoresist layer is coated with a top-coat material.

17. The method of claim 1, wherein the image modifying pattern is formed by a method selected from the group consisting of subtractive nanoimprint lithography, additive nanoimprint lithography, step-and-flash imprint lithography, solid immersion lens near-field imaging, direct write electron-beam, direct-write ion beam lithography and direct beam x-ray lithography.

18. The method of claim 1, wherein the photoresist layer is exposed with imaging radiation of wavelength $\lambda_1$ using a method selected from the group consisting of flood exposure, multiple beam interference exposure, and pattern-wise exposure.

19. The method of claim 1, wherein the photoresist layer is exposed with imaging radiation of wavelength $\lambda_1$ using a light polarization method selected from the group consisting of unpolarized light, circularly polarized light, TE polarized light, and TM polarized light.

20. The method of claim 1, wherein the material layer is selected from the group consisting of ceramic, dielectric, metal and semiconductor layers.

21. The method of claim 1, wherein the step of transferring further comprising etching into the material layer through the patterned photoresist layer to remove portions of the material layer.

22. The method of claim 1, wherein the photoresist composition is a negative tone photoresist.

23. A method of forming a patterned material layer on a substrate, the method comprising
   a. providing a substrate having a material layer on a surface thereof;
   b. applying a chemically amplified photoresist composition on the material layer to form a photoresist layer on the material layer;
   c. applying a material composition on the photoresist layer to form an image modifying material layer on the photoresist layer;
   d. patterning the image modifying material layer to form an image modifying pattern on the photoresist layer;
   e. exposing the image modifying pattern and photoresist layer using imaging radiation of wavelength $\lambda_1$ such that the image modifying pattern causes an intensification of the image intensity within the photoresist layer directly beneath the image modifying pattern, wherein the image modifying pattern is not optically opaque at the imaging radiation wavelength $\lambda_1$;
   f. removing the image modifying pattern;
   g. developing portions of the photoresist layer to thereby form a patterned photoresist layer on the substrate; and
   h. transferring the patterned photoresist layer to the material layer.

* * * * *